United States Patent
Jung

(10) Patent No.: US 7,553,366 B2
(45) Date of Patent: Jun. 30, 2009

(54) LASER BEAM PATTERN MASK AND CRYSTALLIZATION METHOD USING THE SAME

(75) Inventor: Yun Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 469 days.

(21) Appl. No.: 11/528,350

(22) Filed: Sep. 28, 2006

(65) Prior Publication Data

US 2007/0020536 A1      Jan. 25, 2007

Related U.S. Application Data

(62) Division of application No. 10/963,712, filed on Oct. 14, 2004, now Pat. No. 7,132,204.

(30) Foreign Application Priority Data

Dec. 26, 2003      (KR)      .......................... 10-2003-97585

(51) Int. Cl.
*C30B 1/00* (2006.01)
(52) U.S. Cl. ......................................................... 117/4
(58) Field of Classification Search ...................... 430/5; 117/4, 92, 95; 438/166
See application file for complete search history.

(56) References Cited

U.S. PATENT DOCUMENTS

| | | |
|---|---|---|
| 6,177,301 B1 | 1/2001 | Jung |
| 6,316,338 B1 | 11/2001 | Jung |
| 6,323,457 B1 | 11/2001 | Jung |
| 6,326,286 B1 | 12/2001 | Park et al. |
| 6,346,462 B1 | 2/2002 | Jung |
| 6,369,038 B1 | 4/2002 | Blumenfeld et al. |
| 6,514,339 B1 | 2/2003 | Jung |
| 6,521,473 B1 | 2/2003 | Jung |
| 6,536,237 B1 | 3/2003 | Jung |
| 6,537,863 B1 | 3/2003 | Jung |
| 6,706,545 B2 | 3/2004 | Jung |
| 6,736,895 B2 | 5/2004 | Jung |
| 6,755,909 B2 | 6/2004 | Jung |
| 6,770,545 B2 | 8/2004 | Yang |
| 2002/0179004 A1 | 12/2002 | Jung |
| 2003/0219936 A1* | 11/2003 | Kim .......................... 438/166 |
| 2004/0127066 A1 | 7/2004 | Jung |
| 2005/0124145 A1* | 6/2005 | Jung .......................... 438/487 |
| 2005/0142450 A1* | 6/2005 | Jung ............................ 430/5 |

FOREIGN PATENT DOCUMENTS

| | | |
|---|---|---|
| KR | 10-2002-0091896 A | 11/2002 |
| KR | 10-2002-0093194 A | 12/2002 |

OTHER PUBLICATIONS

Sposilli et al., "Single-Crystal Si Films Via A Low-Substrate-Temperature Excimer-Laser Crystallization Method", British Library- "The world's knowledge" www.bl.uk., pp. 953-958.

* cited by examiner

*Primary Examiner*—Stephen Rosasco
(74) *Attorney, Agent, or Firm*—McKenna Long & Aldridge LLP

(57) ABSTRACT

A laser beam pattern mask includes at least one or more transmitting parts, each transmitting part having a central portion and a pair of edge portions provided to both sides of the central portion, each having a substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner.

6 Claims, 8 Drawing Sheets

| normal area | beam overlap area | normal area |

LASER BEAM PATTERN MASK AND CRYSTALLIZATION METHOD USING THE SAME

This application is a divisional of prior application Ser. No. 10/963,712, filed Oct. 14, 2004 now U.S. Pat. No. 7,132,204.

This application claims the benefit of the Korean Application No. P2003-97585 filed on Dec. 26, 2003, which is hereby incorporated by reference.

BACKGROUND OF THE INVENTION

1. Field of the Invention

The present invention relates to silicon crystallization, and more particularly, to a laser beam pattern mask and crystallization method using the same.

2. Discussion of the Related Art

As an information society develops, the demand for a visual display is rising in various ways. A variety of flat display devices have been designed to meet such a demand. Many efforts are now being made to further develop flat display devices, such as a liquid crystal display (LCD) device, plasma display panel (PDP), electroluminescent display (ELD), and vacuum fluorescent display (VFD). Some of these flat display devices are already in use in various types of equipment.

When replacing CRT (cathode ray tube), LCD provides excellent features including excellent image quality, lightweight, compact size, and low power consumption. Thus increasing device portability and becoming the most popular device of the various flat display devices. Moreover, LCD has been also developed to be applicable to TV, a computer monitor, and the like as well as a portable notebook computer monitor.

A liquid crystal display device mainly consists of a liquid crystal display panel and a drive unit that applies a drive signal to the liquid crystal display panel. The liquid crystal display panel consists of first and second glass substrates assembled to each other to leave a predetermined distance from each other and a liquid crystal layer injected between the first and second glass substrates.

A plurality of gate lines are arranged in one direction on the first glass substrate (TFT array substrate) so as to have a predetermined distance between each other. A plurality of data lines are also arranged on the first glass substrate (TFT array substrate) having a predetermined interval between each other in a direction perpendicular to the gate lines. Further, a plurality of pixel electrodes are formed in pixel areas defined between the gate and data lines. Furthermore, a plurality of thin film transistors for transferring signals of the data lines to the corresponding pixel electrodes in response to signals of the gate lines are formed in the pixel regions, respectively. Such an arrangement is an active matrix LCD that provides excellent resolution and implementation of moving pictures by using pixel electrodes connected to thin film transistors.

A black matrix layer that only enables light to be transmitted to the pixel areas is formed on the second glass substrate (color filter substrate). In addition, an R/G/B color filter layer and a common electrode for implementing an image are formed on the second glass substrate (color filter substrate). The first and second glass substrates, between which is a predetermined space provided by spacers, are assembled to each other by a seal material having a liquid crystal injection inlet. Liquid crystals are then injected in the predetermined space via the liquid crystal injection inlet.

The operational principle of a general liquid crystal display device lies in making use of optical anisotropy and polarization characteristic of the liquid crystals. Liquid crystals have a thin and long shape that provides direction in the molecular arrangement. A direction of the molecular arrangement can be controlled by applying an electric field to the liquid crystals. A molecular arrangement direction of the liquid crystals can be adjusted such that the molecular arrangement of the liquid crystals is changed to refract light in the molecular arrangement direction of the liquid crystals by optical anisotropy to display image information.

In a liquid crystal display device including thin film transistors in which semiconductor layers are formed of polysilicon, the thin film transistors and a driver circuit can be provided on the same substrate so that the process of connecting the thin film transistors and the driver circuit is unnecessary, which simplifies the manufacturing process. Field effect mobility of polysilicon is 100~200 times greater than that of amorphous silicon, and provides fast response speed and excellent stability in spite of high temperatures and light. Polysilicon can be formed by a high-temperature process or a low-temperature process. The high-temperature process requires a process temperature of about 1,000° C., which exceeds a transformation temperature of an insulating substrate. Hence, the high-temperature polysilicon process needs an expensive quartz substrate having high heat resistance. A polysilicon film formed by the high-temperature process shows low-grade crystalline properties, such as high surface roughness, fine grain size, and the like, thereby being inferior to polysilicon formed by the low-temperature process in terms of device operation characteristics. Hence, many efforts are being made to research and develop polysilicon formed by crystallization using amorphous silicon that can be deposited at low temperature.

The low-temperature process can be categorized into laser annealing, metal induced crystallization. Laser annealing is carried out in a manner of applying a pulse type laser beam to amorphous silicon on an insulating substrate. By using a pulse type laser beam, melting and solidification are repeated using 101~102 nanosecond pulse such that damage to the lower insulating substrate is minimized. Much attention has been paid to laser annealing of amorphous silicon as a low-temperature crystallization process.

FIG. 1 is a graph of an amorphous silicon grain size according to laser energy density. Referring to FIG. 1, a crystallization area of amorphous silicon can be divided into first to third regions according to intensity of laser beam energy. The first region is a partial melting region, in which laser energy having intensity capable of partially melting a surface of an amorphous silicon layer is applied to the amorphous silicon layer. In the first region, a partial melting occurs just at the surface of the amorphous silicon layer after the laser beam irradiation. After solidification of the melted portions, small crystalline grains are formed on the surface of the amorphous silicon layer.

The second region is a near-complete melting region, in which laser energy is nearly able to melt the entire amorphous silicon layer is irradiated by increasing the laser energy intensity higher than that used in the first region. After melting, the grain grows larger than that of the first region by growing crystals from small nucleuses remaining as seeds. Yet, the second region fails to provide homogenous grains. Besides, the second region is considerably smaller than the first region.

The third region is a laser intensity sufficient to achieve complete melting, in which laser energy can entirely melt the amorphous silicon layer is irradiated by a laser energy intensity higher than that of the second region. Solidification proceeds after completion of melting the amorphous silicon layer, thereby enabling homogenous nucleation. After completion of irradiation, a crystalline silicon layer consisting of fine homogenous grains is formed.

To form large grains uniformly using the energy density of the second region, the number of irradiations of the laser beam and overlapping regions thereof are adjusted in the polysilicon forming process. Yet, a plurality of grain boundaries of polysilicon works as obstacles against a current flow, thereby inhibiting the production of a reliable thin film transistor device. A colliding current and degradation caused by collision between electrons within a plurality of the grains breaks down into an insulator, which results in product failure. To overcome such a problem, a single-crystalline amorphous silicon fabrication by SLS (sequential lateral solidification) has been proposed that is based on the fact that silicon grains grows on a boundary between liquid silicon and solid silicon in a direction vertical to the boundary (Robert S. Sposilli, M. A., Crowder, and James S. Im, *Mat. Res. Soc. Symp. Proc.*, Vol. 452, 956~957, 1997).

In SLS, a silicon grain is laterally grown to a predetermined length by appropriately adjusting laser energy intensity, laser beam irradiated range, and laser beam translation distance such that amorphous silicon can be crystallized into single crystalline silicon longer than 1 μm (micrometer). Thus, a laser beam system used in the SLS focuses a laser beam on a narrow area, thereby unable to change all of the amorphous silicon on a substrate into single crystalline silicon at one time. Hence, to change a target area of the substrate, the substrate having an amorphous silicon layer deposited thereon is loaded onto a moving stage. After completely irradiating a predetermined area of the substrate, the substrate is moved to perform a next irradiation on a next area of the substrate. Thus, the irradiations are performed over all of the amorphous silicon on the substrate.

FIG. 2 is a schematic diagram of a general SLS irradiation system. Referring to FIG. 2, the SLS irradiation system consists of a laser beam generator (not shown in the drawing) generating a laser beam, an attenuator 1 decelerating the laser beam by adjusting energy intensity of the laser beam, a first mirror 2a changing the path of the laser beam, a telescope lens 3 spreading the laser beam, a second mirror 2b changing the path of the laser beam again, a homogenizer & condenser lens 4 uniformly condensing the laser beam, a third mirror 2C bending to change the path of the laser beam, a field lens 5 appropriately modifying a shape of the laser beam into an incident level of a laser beam pattern mask, a laser beam pattern mask 6 transmitting the laser beam into a predetermined pattern, and a projection lens 7 reducing the laser beam transmitted through the laser beam pattern mask 6 at a reduction ratio to irradiate the reduced laser beam on a substrate 10. The laser beam generator is an excimer laser typically using 308 nm XeCl or 248 nm KrF. The laser beam generator discharges a non-treated laser beam.

The discharged laser beam is passed through the attenuator 1, various mirrors 2a, 2b, and 2c to change its path and a laser beam pattern mask 6 so as to be irradiated on the substrate 10 with a predetermined laser beam pattern. The mirrors 2a, 2b, and 2c are provided to maximize the utilization of a space instead of elongating the space occupied by the SLS irradiation system in one direction. In some cases, the number of the mirrors can be adjusted to increase or decrease the space occupied by the SLS irradiation system.

A stage 8, on which the substrate 10 having an amorphous silicon layer deposited thereon is loaded, is placed in front of the laser beam pattern mask 6. As the substrate 10 is loaded on the stage 8 from outside, a fixing means for fixing the substrate 10 onto the stage 8 is provided to prevent the substrate 10 from moving on the movement of the stage 8. In order to crystallize the entire area of the substrate 10, the X-Y stage 8 is moved little by little to gradually extend a crystallized area.

The laser beam pattern mask 6 is divided into a transmitting part transmitting the laser beam and a cut-off part that cuts off the laser beam. A width of the transmitting part determines a lateral growth length of a grain formed by one exposure. The laser beam pattern mask 6 can have a pattern as explained in detail by referring to the attached drawings as follows. The present inventor has filed U.S. patent application Ser. No. 10/454,679 to a pattern for a lateral solidification and crystallization method of amorphous silicon, which is hereby incorporated by reference. Further, the present inventor is also an inventor in U.S. Pat. Nos. 6,755,909, 6,736,895, 6,489,188 and 6,326,286, which are also hereby incorporated by reference.

FIG. 3 is a layout of a laser beam pattern mask used for laser irradiation, and FIG. 4 is a diagram of crystallized regions formed by a first laser beam irradiation using the laser beam pattern mask in FIG. 3. Referring to FIG. 3, a laser beam pattern mask 3 used in laser irradiation consists of a plurality of transmitting parts 'A' having open patterns with a first interval 'a', respectively and a plurality of cutoff parts 'B' having closed patterns with a second interval 'b', respectively. The transmitting and cutoff parts 'A' and 'B' are alternately provided to the laser beam pattern mask 3.

A laser beam irradiation method using the laser beam pattern mask is explained as follows. First, a laser beam is irradiated onto a substrate having an amorphous silicon layer deposited thereon using the laser beam pattern mask 3. In doing so, the laser beam passes through a plurality of the transmitting parts 'A' provided on the laser beam pattern mask 3. A portion 22, which corresponds to the each of the transmitting parts 'A', is melted into a liquid phase. Thus, the intensity of the laser energy used is in the complete melting region, that is, enough energy to completely melt the irradiated portion 22 of the amorphous silicon layer. An irradiated region of the substrate, such as the area defined by width 'L'×length 'S' corresponding to a region of the laser beam pattern mask where a plurality of the consecutive transmitting parts 'A' are formed, is called a unit region 20.

After completion of the laser beam irradiation, lateral growth of silicon grains 24a and 24b proceeds from interfaces 21a and 21b between an amorphous silicon region and the liquefied silicon region after complete melting. The lateral growth of the grains 24a and 24b occurs in a direction vertical to the interfaces 21a and 21b. If a width of the irradiated portion 22 corresponding to the transmitting part 'A' is smaller than double the growth length of the crystallized silicon grain 24a, the grains vertically grown inward from both of the interfaces 21a and 21b with the amorphous silicon region and the irradiated portion 22 collide with each other and stop growing.

To further grow the silicon grains, the stage having the substrate loaded thereon is moved so that another irradiation is performed on a neighboring region adjacent to the irradiated portion to form crystals connected to the former crystals formed by the first irradiation. Likewise, crystals are laterally formed from both sides of an irradiated portion are instantly melted by the second irradiation. Generally, a length of the crystalline growth connected to the neighbor irradiated portion by laser irradiation depends on widths of the transmitting and cutoff parts 'A' and 'b' of the laser beam pattern mask.

FIG. 5 is a layout of a crystallization sequence of a process according to a related art. Referring to FIG. 5, silicon crystallization proceeds on a substrate 10 according to a sequence shown in FIG. 5.

A first translation T1 is made in the following manner. An exposed portion of the substrate 10 is moved to a left side from a right side (in a (−)X-axis direction) to correspond to the transmitting part beam length 'L' of the laser beam pattern mask 6 in FIG. 3. An irradiation is then performed in a horizontal direction of the substrate 10.

Subsequently, a second translation T2 is made in the following manner. The exposed portion of the substrate 10 is moved to a lower side from an upper side (in a (−)Y-axis direction) to correspond to a ½ width [(a+b)/2] of the transmitting and cutoff parts 'a' and 'b'.

A third translation T3 is then made in a following manner. The exposed portion of the substrate 10 is moved to the right side from the left side (in a (+)X-axis direction) to correspond to the transmitting part beam length 'L'. And, crystallization is performed on each region, on which the irradiation after the first translation T1 fails to be performed, of the unit regions of the substrate 10 corresponding to the laser beam pattern mask 6. In doing so, the laser beam irradiated region of the third translation T3 is overlapped in part with that of the first translation b so that crystals can continue to grow from the former crystals.

Subsequently, a fourth translation T4 is made in a following manner. The exposed portion of the substrate 10 is moved to the lower side from the upper side (in a (−)Y-axis direction) to correspond to the vertical length 'S' of the laser beam pattern mask 6. And, the processes of the first to third translations T1 to T3 are repeated to perform crystallization on the entire surface of the substrate 10. In the above-explained crystallization, the stage 8 in (FIG. 2) having the substrate 10 loaded thereon is moved to perform the crystallization while the laser beam pattern mask 6 is fixed. In doing so, the corresponding translation of the stage 8 is made in a direction opposite to the crystallizing direction on the substrate 10.

FIG. 6 is a diagram of beam overlap occurring on a predetermined area after completion of crystallization across an entire area of a substrate according to the related art. Referring to FIG. 6, when crystallization makes progress by moving the substrate 10 according to the sequence in FIG. 5, unit regions C1, C2, . . . Cm, Cm+1, . . . of the substrate corresponding to one laser beam irradiation are moved to perform crystallization. Looking into a predetermined area of the substrate after completion of the crystallization, beam overlap areas 01 and 02, where the transmitting part 'A' corresponds at least twice between adjacent laser irradiation areas, take place. Namely, the beam overlap area 01 takes place when irradiation is performed after the X-axis directional translation of the substrate corresponding to the length 'L' of the laser beam pattern mask 6. And, the beam overlap area 02 takes place when irradiation is performed after the Y-axis directional translation of the substrate corresponding to the length '(a+b)/2' of the laser beam pattern mask 6. There are doubly exposed portions 51 and 52 overlapped in one direction of X- or Y-axis. And, there is a quadruply exposed portion 53 overlapped in both directions of the X- and Y-axis.

The laser beam is irradiated at least twice on the beam overlap area 01 vertical to a crystalline orientation direction among the beam overlap areas 51, 52, and 53. In doing so, the formerly formed grains are melted in part to be crystallized again, whereby the final grains are formed tilted. If a device is placed on such a tilted portion, mobility is lowered so as to degrade the characteristics of a device later formed on the portion.

FIG. 7 is a SEM picture representing a degree of crystallization appearing on a normal or beam overlap area according to the related art. Referring to FIG. 7, compared to a crystallization degree of a normal area, a crystallization degree appearing in a beam overlap area of adjacent laser beam pattern areas on crystallization has an irregular characteristic. Specifically, grains in the beam overlap area are formed in a tilted direction, whereas grains of the normal area are formed in a vertical direction. When patterning is performed so that devices of one line are formed on a normal area in part and that the rest of the devices are formed on one of the beam overlap areas, devices characteristics for each of the devices will be inconsistent.

As mentioned in the foregoing description, the related art laser beam pattern mask and crystallization method using the same have the following problems or disadvantages. First of all, in irradiating the laser beam onto the substrate using the laser beam pattern mask, beam overlap areas occur between the adjacent laser beam pattern area. More specifically, edge portions of adjacent laser beam irradiation pattern areas overlap with each other and the shape of the laser beam irradiation pattern area is like a shape of the transmitting part provided in the laser beam pattern mask. Yet, center and edges of the transmitting part of the related art laser beam pattern mask are rectangular, whereby the beam overlap area on the substrate using the mask has a rectangular shape as well. The beam overlap area has crystallization characteristics that are irregular as compared to the non-overlapped area. Specifically, in fabricating a thin film transistor array substrate to manufacture a flat panel display such as a liquid crystal display device, device characteristics can be changed such that operational malfunctions occur in a thin film transistor (TFT) located on the beam overlap area.

SUMMARY OF THE INVENTION

Accordingly, the present invention is directed to a laser beam pattern mask and crystallization method using the same that substantially obviate one or more problems due to limitations and disadvantages of the related art.

An object of the present invention is to provide a laser beam pattern mask and crystallization method using the same, by which crystallization characteristics of a beam overlap area are enhanced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a laser beam pattern mask includes at least one or more transmitting parts, each transmitting part having a central portion and a pair of edge portions provided to both sides of the central portion, each having a substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner.

In another aspect of the present invention, a laser beam pattern mask including: at least one first transmitting part having a central portion and a pair of edge portions provided to both sides of the central portion, each having a substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner; and at least one second transmitting part separated from the at least one first transmitting part by a first distance in a horizontal direction about equal to a length of the central part or a second distance in a vertical direction about equal to width of the central portion.

In another aspect of the present invention, a crystallization method includes the steps of: preparing a substrate having an amorphous silicon layer deposited thereon; fixing the substrate to a stage; placing a laser beam pattern mask over the substrate, the laser beam pattern mask comprising at least one or more transmitting parts, each laser beam pattern having a rectangular central portion and a pair of edge portions provided to both sides of the central portion, each having a substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner; and performing a laser beam irradiation for crystallizing the amorphous silicon using the laser beam pattern mask by overlapping the central portion of a next irradiation with an irradiated portion corresponding to the edge portion exposed in a previous irradiation.

In a further aspect of the present invention, a crystallization method includes the steps of: preparing a substrate having an amorphous silicon layer deposited thereon; fixing the substrate to a stage; placing a laser beam pattern mask over the substrate, the laser beam pattern mask having at least one first transmitting part with a rectangular central portion; and a pair of edge portions provided to both sides of the central portion, each having a substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner; at least one second transmitting part separated from the at least one first transmitting part by a first distance in a horizontal direction equal to a length of the central part or a second distance in a vertical direction equal to width of the central part; and performing a laser beam irradiation for crystallizing the amorphous silicon using the laser beam pattern mask by overlapping the central portion of a next irradiation with an irradiated portion corresponding to the edge portion exposed in a previous irradiation.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute part of this specification, illustrate embodiments of the invention and together with the description serve to explain the principles of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
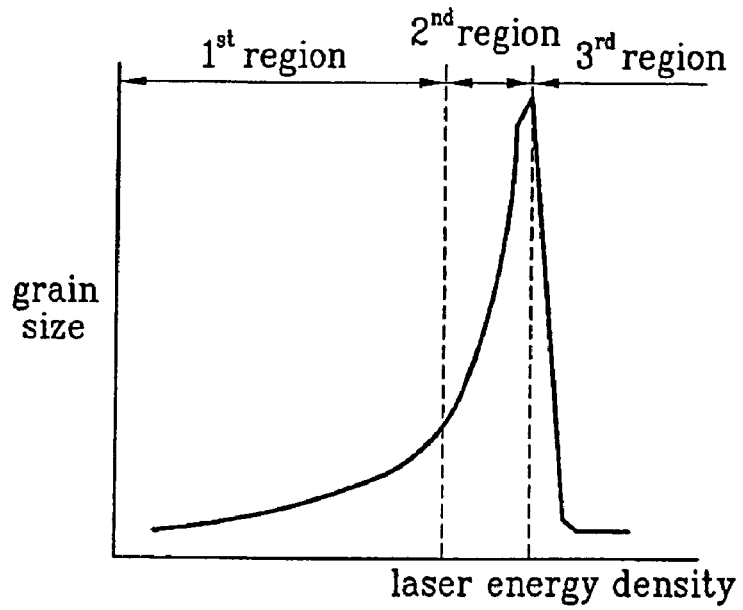
FIG. 1 is a graph of an amorphous silicon grain size according to laser energy density.
Figure 2:
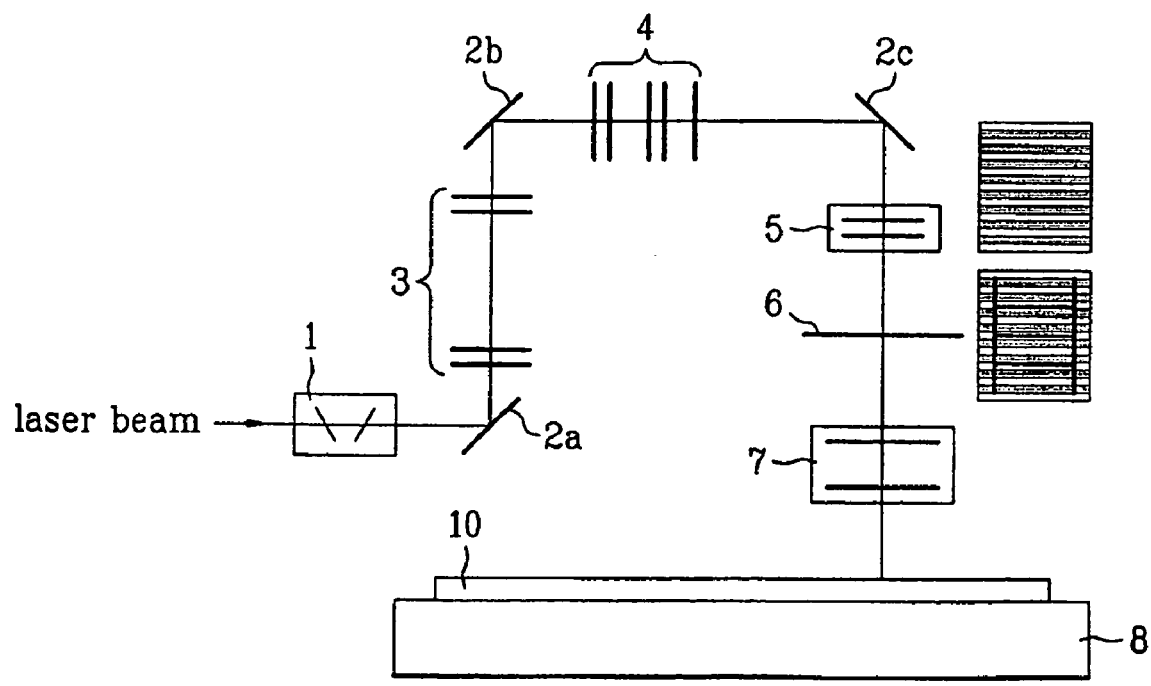
FIG. 2 is a schematic diagram of a general SLS irradiation system.
Figure 3:
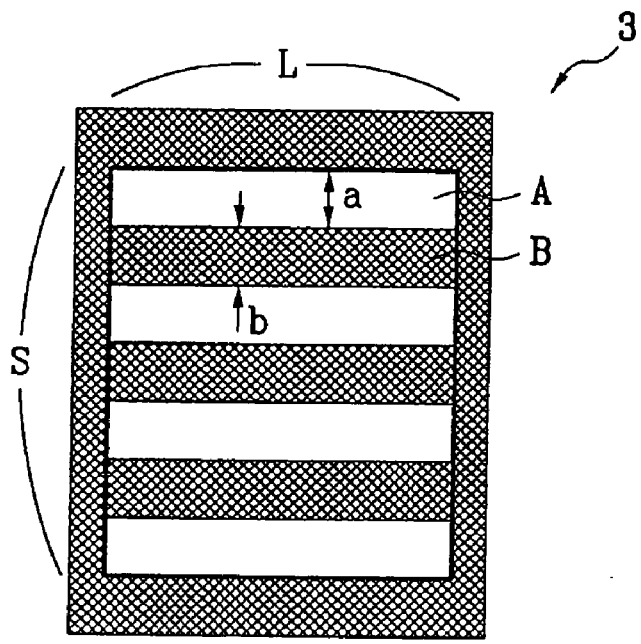
FIG. 3 is a layout of a laser beam pattern mask used for laser irradiation.
Figure 4:
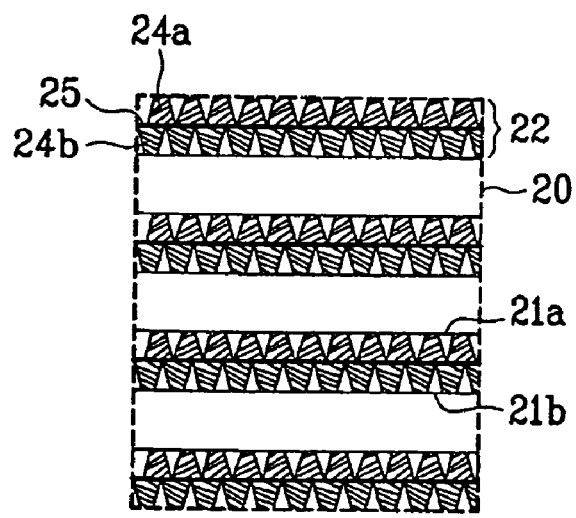
FIG. 4 is a diagram of crystallized regions formed by a first laser beam irradiation using the laser beam pattern mask in FIG. 3.
Figure 5:
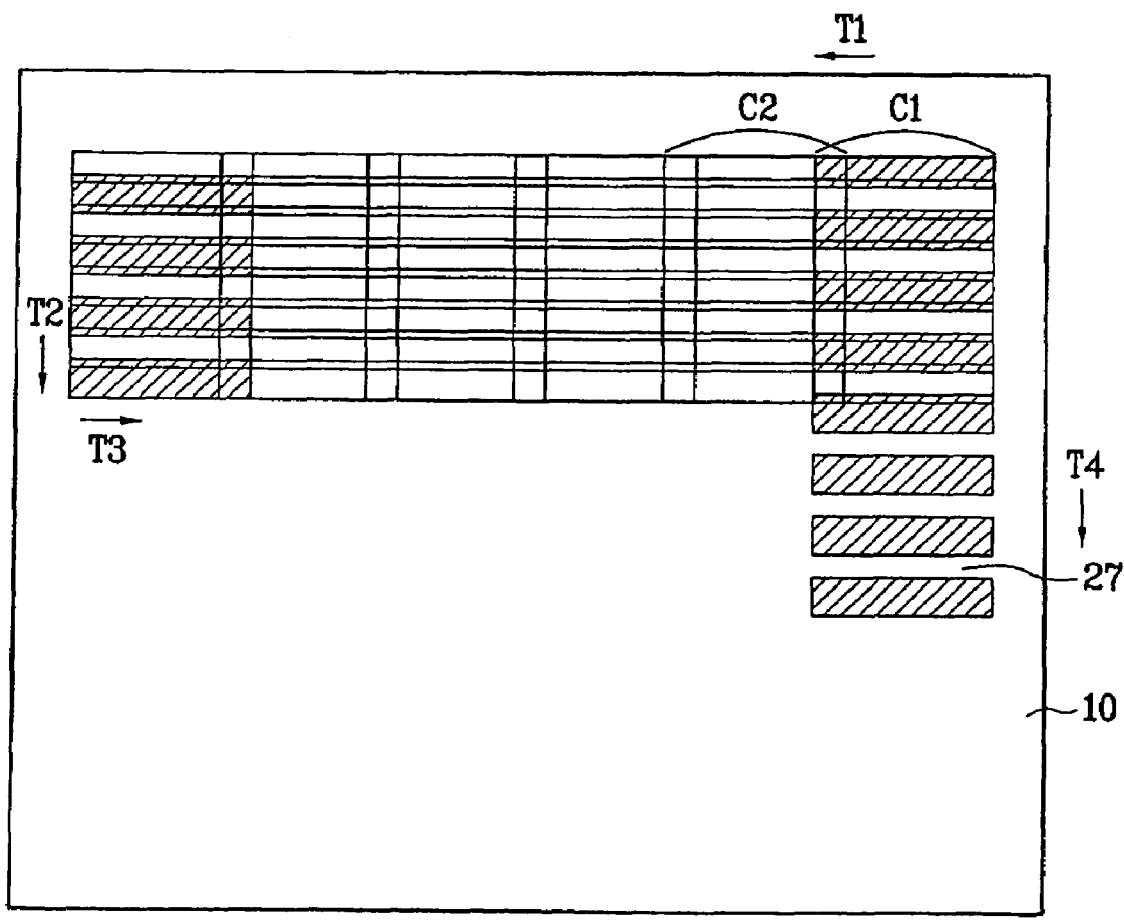
FIG. 5 is a layout of a crystallization sequence of a process according to the related art.
Figure 6:
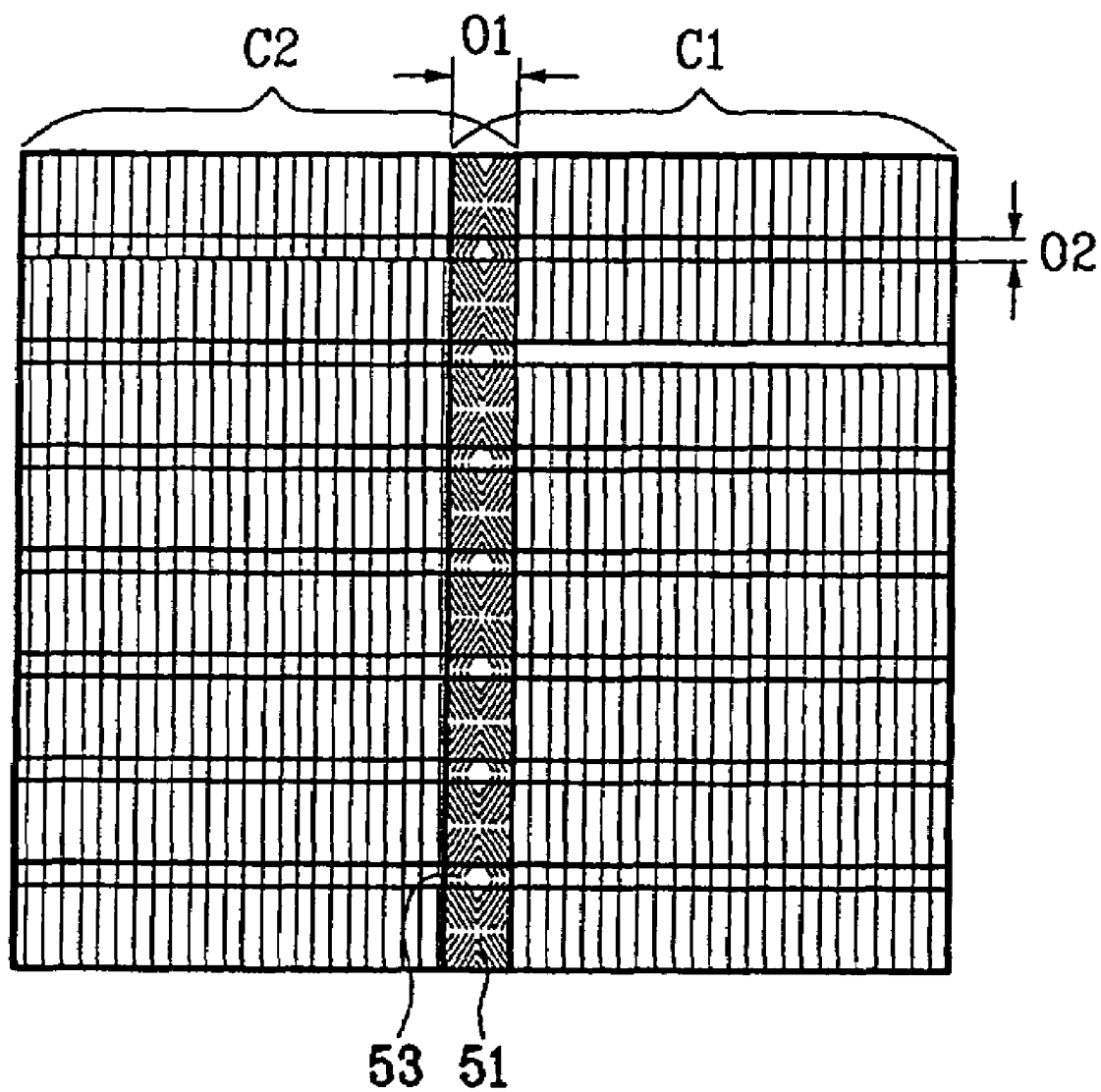
FIG. 6 is a diagram of a beam overlap occurring on a predetermined area after completion of crystallization across an entire area of a substrate according to the related art.
Figure 7:
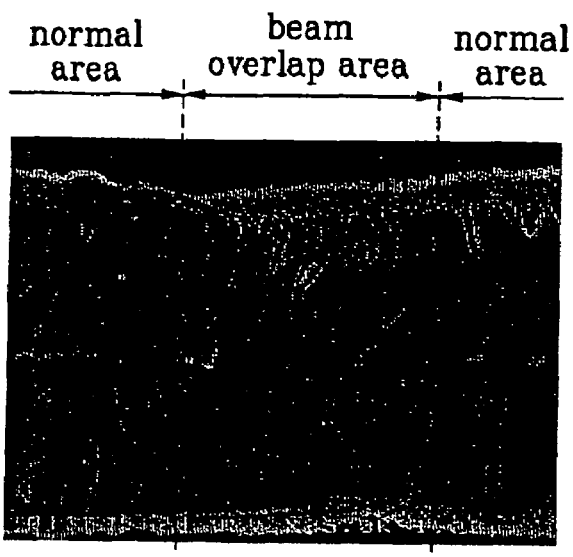
FIG. 7 is a SEM picture representing a degree of crystallization appearing in a beam overlap area according to the related art.
Figure 8:
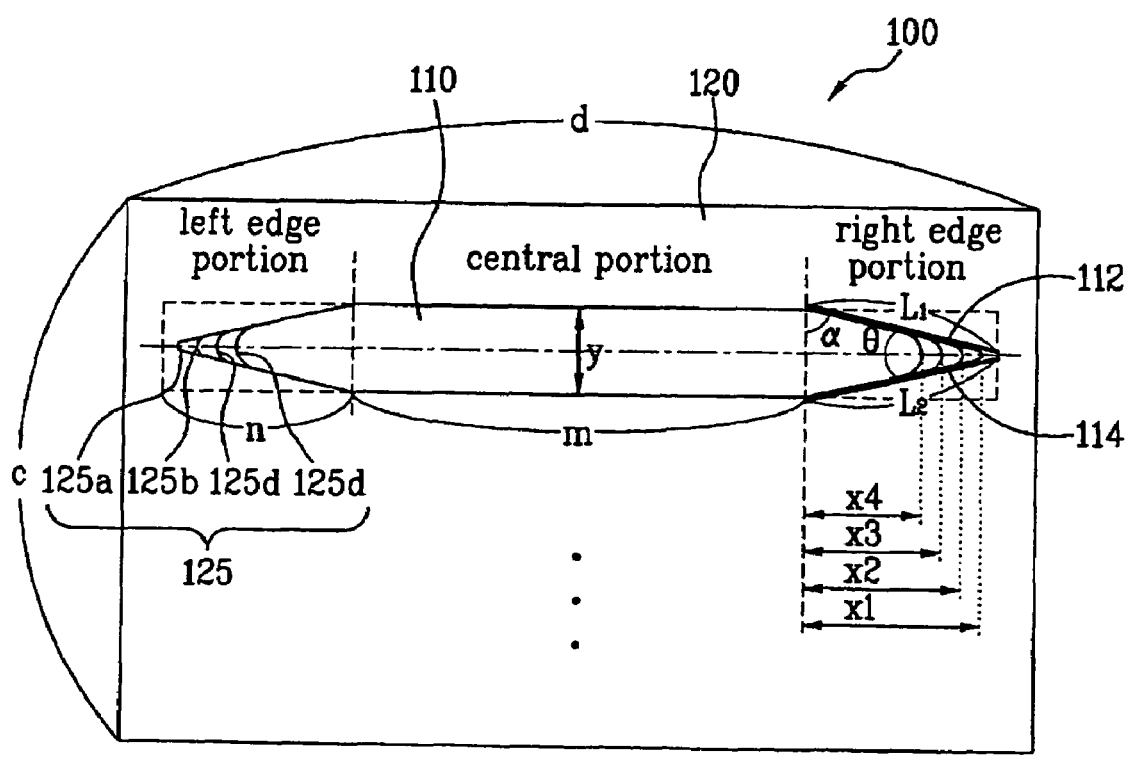
FIG. 8 is a layout of a transmitting part of a laser beam pattern mask having edge portions according to a first embodiment of the present invention.

FIG. 8 is a layout of a transmitting part of a laser beam pattern mask having edge portions according to a first embodiment of the present invention. Referring to FIG. 8, a laser beam pattern mask 100 according to a first embodiment of the present invention includes a plurality of transmitting parts 110, each of which spaced apart from each other in a vertical direction. The rest of the area of the laser beam pattern mask 100 excluding a plurality of the transmitting parts 110 is a cutoff part 120. Each of the transmitting parts 110 includes a central portion and a pair of edge portions provided to both sides of the central portion, respectively. The central portion can be rectangular. Each of the edge portions has a substantially triangular shape with one side defined by a virtual boundary line with the central portion, an upper outside 112 tilted up at an acute angle α from the upper end of the virtual boundary line, and a lower outside 114 tilted down at the same acute angle α from the lower end of the virtual boundary line. The upper and lower outsides 112 and 114 meet each other at one rounded corner bisected by a center line of the edge portion.

If the virtual boundary line between the central portion and the corresponding edge portion is taken as a base line of a virtual triangular shape, a length 'n' of the virtual triangular shape is equal to or smaller than ½ of a length 'm' of the central portion and the length 'x' of the substantially triangular-shaped corresponding edge portion within the virtual triangular shape is set longer than ½ of the length 'n' of the virtual triangular shape. Since the upper outside 112 meets the lower outside 114 indirectly via the rounded corner 125, the length 'x' of the corresponding edge portion is smaller than the length 'n' of the virtual triangular shape. The transmitting parts 110 can have a width 'y', a length 'm' of the central portion and a length 'x' of the corresponding edge portion such that y≦x≦m/2 of the central portion.

The substantially triangular shape is like an isosceles triangle, in which the extension L1 of the upper outside 112 of the edge portion is equal in length to the extension L2 of the lower outside 114 of the edge portion. The two extensions L1 and L2 meet each other at an angle θ. The angle θ between the extensions L1 and L2 is 20°~80°. If the angle θ exceeds a range of 20°~80°, a horizontal length 'x' of the edge portion becomes too long or too short so as to have difficulty in obtaining the demanded crystallization characteristics in an overlap area of the laser beam pattern. The size of the substantially triangular shape depends on the angle θ between the two extensions L1 and L2. Since the acute angle α between the virtual boundary line and the extension L1 is determined by 180°-(90°+θ/2), where a range of the acute angle α lies between 50°~80°.

In the drawing, implementations of the lengths x1, x2, x3, and x4 of the corresponding edge portion are shown in a manner of decreasing the length of the upper or lower outsides in order. Each corner 125a, 125b, 125c, or 125d of the edge portions are rounded parts of the triangular shape. The length x1, x2, x3, or x4 of the edge portion depends on a distance to the corner of the corresponding edge portion from a center of the virtual boundary line between the central and edge portions. A width of the central portion of the corresponding transmitting part 110 is 'y'.

Figure 9:
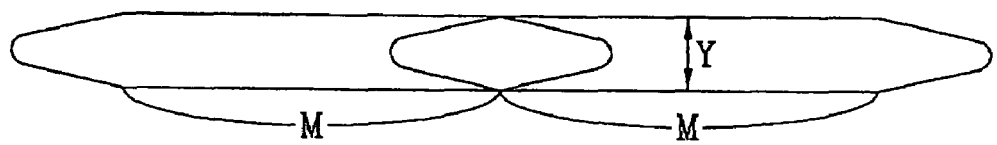
FIG. 9 is a diagram of representing a beam overlap area in the case of having performed first and second irradiations using the laser beam pattern mask in FIG. 8.

FIG. 9 is a diagram of representing a beam overlapping degree in case of performing first and second irradiations using the laser beam pattern mask in FIG. 8. Referring to FIG. 9, crystallization is performed by applying a beam pattern to a substrate using the laser beam pattern mask 100 provided with the transmitting parts in FIG. 8. In doing so, the substrate is horizontally moved to a distance corresponding to a length of the central portion plus one of the edge portions of the laser beam pattern mask 100 to perform. An actual translation distance of the substrate is found by multiplying the lengths of the central portion and one of the edge portions of the laser beam pattern mask 100 by a reduction ratio of a projection lens provided under the mask 100. Hence, the length 'm' and width 'y' of the central portion of the laser beam pattern mask 100 are reduced to sizes 'M' and 'Y' via the projection lens on crystallization, respectively. And, the beam overlap area between the laser beam pattern areas includes one edge portion in the first irradiation and the other edge portion in the second irradiation, thereby having a horizontal length '2X' corresponding to double the length 'x' of one edge portion.

In this case, one edge portion in the first irradiation is made to be included in the central portion in the second irradiation. Hence, the beam overlap area corresponds to a length 'X' across the right edge portion and central portion of one laser beam pattern area in the first irradiation and then corresponds to another length 'X' across the left edge portion and central portion of the other laser beam pattern area in the second irradiation.

Figure 10:
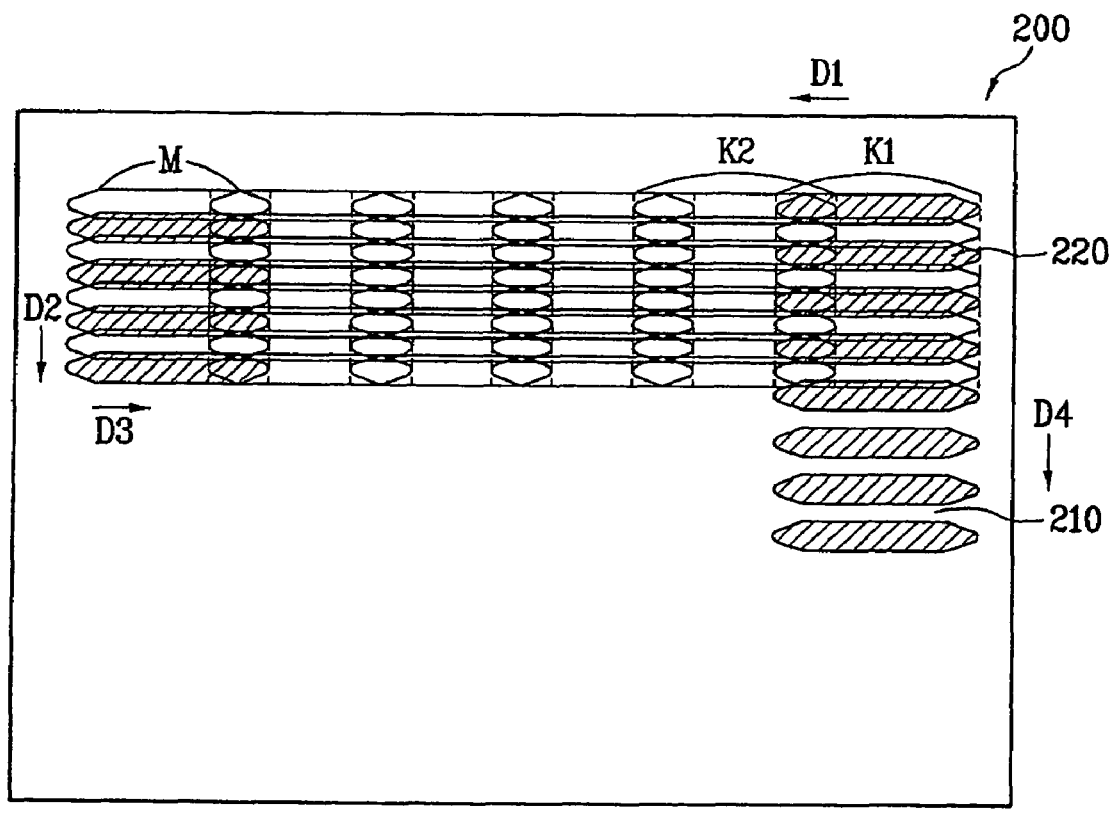
FIG. 10 is a process layout of a crystallization sequence using the laser beam pattern mask in FIG. 8.

FIG. 10 is a process layout of a crystallization sequence using the laser beam pattern mask in FIG. 8. Referring to FIG. 10, a crystallization method using a laser beam pattern mask according to a first embodiment of the present invention includes the following steps.

First, a substrate 200 having an amorphous silicon layer 210 deposited thereon is prepared. The substrate 200 is fixed onto a stage (not shown in the drawing). A laser beam pattern mask is prepared. The laser beam pattern mask ('100' in FIG. 8) includes a plurality of transmitting parts 110 at predetermined intervals. Each of the transmitting parts includes a central portion and a pair of edge portions provided to both sides of the central portion, respectively. The central portion can be rectangular. Each of the edge portions has a substantially triangular shape defined by a virtual boundary line with the central portion, an upper outside tilted at an acute angle from an upper end of the virtual boundary line, and a lower outside tilted at the same acute angle from a lower end of the virtual boundary line. The upper and lower outsides meet each other at a rounded corner. Subsequently, laser beam irradiation for crystallization is carried out so that the edge portion of the laser beam pattern mask 100 overlaps an area of adjacent laser beam patterns on the substrate 200.

In performing the laser beam irradiation, transition of an irradiation (exposed) area on the substrate 200 is made by moving a stage having the substrate 200 fixed thereon. In doing so, a translation distance of the stage is adjusted by considering a length or width of each of the transmitting parts of the mask and a reduction ratio of a projection lens. First, an irradiation is made to perform crystallization in a first direction D1 on the substrate 200 by moving the stage (not shown in the drawing) in a (+)X-axis direction to a distance 'M' corresponding to the length 'm' of the central portion of the corresponding transmitting part of the laser beam pattern mask 100.

Second, the stage is moved in a (+)Y-axis direction to a distance corresponding to the width 'y' of the central portion of the laser beam pattern mask 100. In moving the stage, a laser beam irradiated area is formed on the substrate 200 in a second direction D2.

Third, irradiation is performed on the substrate 200 to achieve the crystallization in a third direction D3 by moving the stage in a (−)X-axis direction opposite to the direction in the first step to a distance 'M' corresponding to the length 'm' of the central portion of the corresponding transmitting part of the laser beam pattern mask 100.

Fourth, the stage is moved in a (+)Y-axis direction to a vertical length of a unit region K1, K2 . . . crystallized by one irradiation on the substrate 200 using the laser beam pattern mask 100. In moving the stage, a laser beam irradiated area is formed on the substrate 200 to correspond in a fourth direction D4.

The above-explained first to fourth steps are repeated to crystallize the entire amorphous silicon layer 210 deposited on the substrate 200. Meanwhile, in a size of a laser beam pattern mask used for a crystallizing process, a horizontal length 'd' is about 5 mm~10 mm and a vertical length 'c' is about 50 mm~150 mm. For instance, when the horizontal and vertical lengths 'd' and 'c' of the laser beam pattern mask 100 are 5 mm and 100 mm, respectively, if a horizontal length of one transmitting part 110 is '5 mm-2β', i.e., (horizontal length of mask)−2* (an interval between edge portion of transmitting part and mask edge), if a width of the central portion is 12.5 μm, and if a distance between two adjacent transmitting parts is 10.0 μm, total 4,444 transmitting parts are provided within the laser beam pattern mask 100 according to 100 mm/(12.5 μm+10.0 μm).

A laser beam pattern is reduced to ¼ or ⅕ according to a reduction ratio of the projection lens to form a line type pattern having rounded edges when passed through the corresponding transmitting part 110 of the laser beam pattern mask 100 and the projection lens (not shown in the drawing).

In the line type pattern having the rounded edges, a central part of the line type pattern has 3.125 µm width and 1.25 mm length or 2.5 µm width and 1.0 mm length. Besides, an unexplained reference number '220' in the drawing indicates each crystallized portion of the amorphous silicon layer deposited on the substrate 200.

Figure 11:
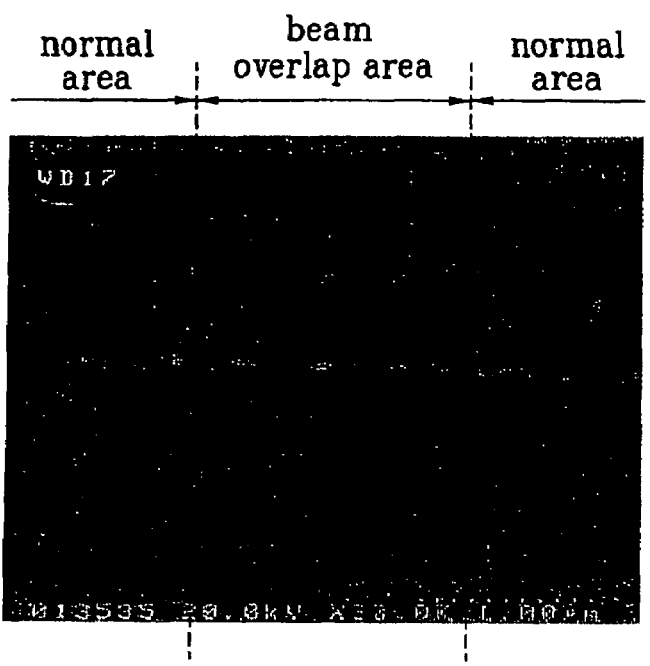
FIG. 11 is a SEM picture representing a degree of crystallization appearing in a beam overlap area using the laser beam pattern mask in FIG. 8.

FIG. 11 is a SEM picture representing a degree of crystallization appearing in a beam overlap area using the laser beam pattern mask in FIG. 8. Referring to FIG. 11, a corner of each substantially triangular shaped edge portion, which is defined by a virtual boundary line with a central portion, an upper outside at an acute angle from an upper end of the virtual boundary line, and a lower outside at the same acute angle from a lower end of the virtual boundary line, is rounded. A corner-rounded left edge portion is overlapped with a corner-rounded right edge portion in a laser beam overlap area on a substrate on irradiation, whereby crystallization thereof is evenly achieved to be nearly equivalent to that of a normal area.

Figure 12:
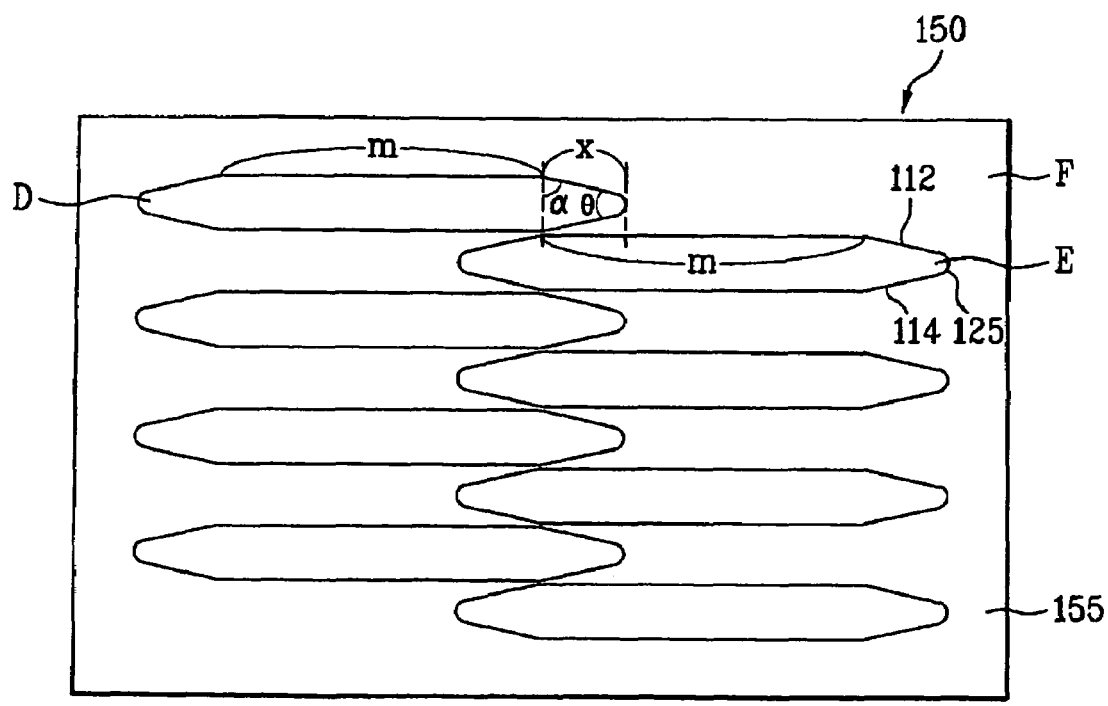
FIG. 12 is a layout of a transmitting part of a laser beam pattern mask having edge portions according to a second embodiment of the present invention.

FIG. 12 is a layout of a transmitting part of a laser beam pattern mask having edge portions according to a second embodiment of the present invention. Referring to FIG. 12, a laser beam pattern mask 150 according to a second embodiment of the present invention is a single scan laser beam pattern mask enabling crystallization by two shots on each unit region occurring on irradiation on a substrate.

A laser beam pattern mask 150 according to a second embodiment of the present invention includes a plurality of first transmitting parts 'D' and a plurality of second transmitting parts 'E' having the same shapes of the first transmitting parts 'D'. Each of the first transmitting parts 'D' includes a central portion and a pair of edge portions provided to both sides of the central portion, respectively to have the same shape of the transmitting part according to the first embodiment of the present invention shown in FIG. 8. And, each of the edge portions has a virtual triangle shape defined by a virtual boundary line with the central portion, an upper line 112 tilted at an acute angle α from an upper end of the virtual boundary line, and a lower line 114 tilted at the same angle of acute angle α from a lower end of the virtual boundary line. The upper and lower outside 112 and 114 meet each other at one rounded corner. Moreover, the second transmitting part 'E' is located at a position translated from that of the corresponding first transmitting part 'D' by a length 'm' of the central portion in a horizontal direction and a width 'y' of the central portion in a vertical direction.

The acute angle α between the upper outside 112 of the edge portion and the virtual boundary line is the same acute angle α between the lower outside 114 of the edge portion and the virtual boundary line. A range of the acute angle α is between 50°~80°. The length of the central portion is determined to be at least twice longer than that of one of the edge portions so the length of the edge portions can not be too long. Moreover, a plurality of the first transmitting parts 'D' are arranged parallel to each other to vertically leave a predetermined distance from each other. A plurality of the second transmitting parts 'E' are arranged parallel to each other to vertically leave a predetermined distance from each other as well. In doing so, the predetermined distance between the first transmitting parts 'D' is set equal to that between the second transmitting parts 'E'. Like the first embodiment of the present invention, the rest of the laser beam pattern mask 150, excluding a plurality of the first and second transmitting parts 'D' and 'E', is a cutoff part 155.

Figure 13:
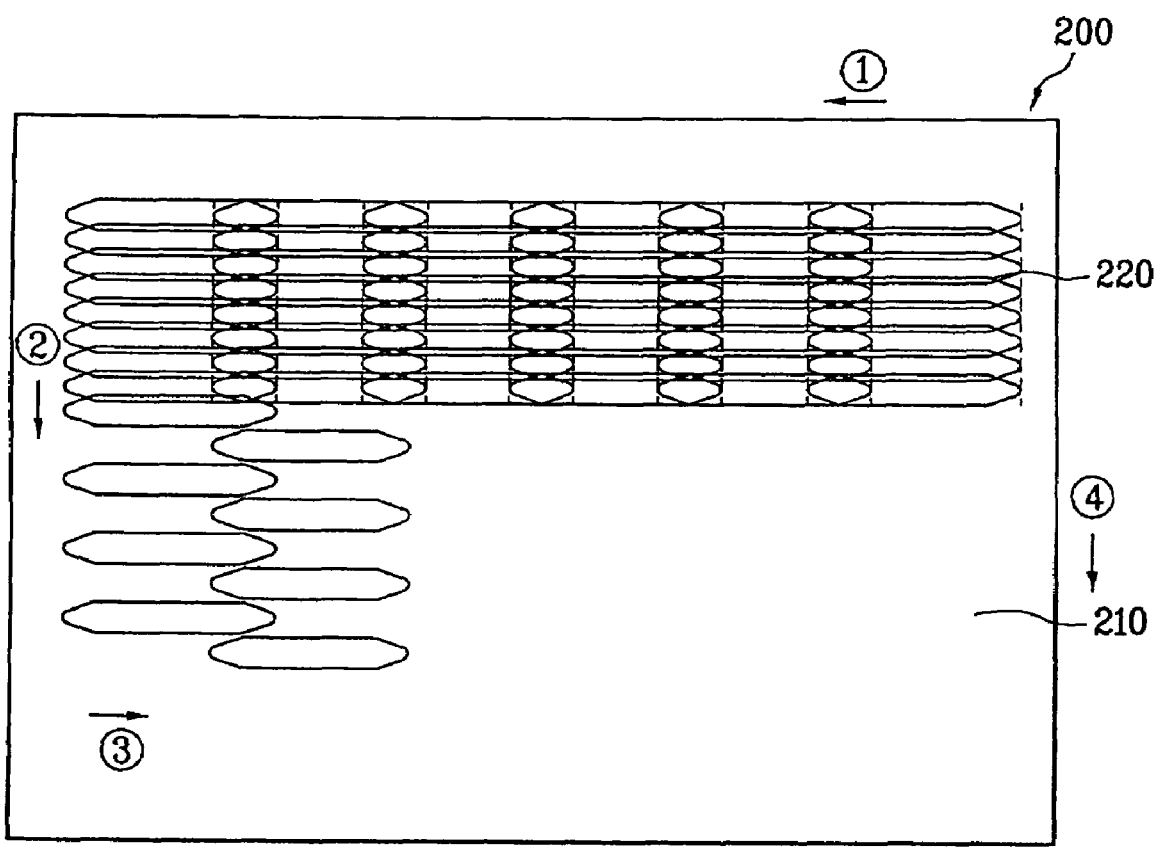
FIG. 13 is a process layout of a crystallization sequence using the laser beam pattern mask in FIG. 12.

FIG. 13 is a process layout of a crystallization sequence using the laser beam pattern mask in FIG. 12. Referring to FIG. 13, a crystallization method using a laser beam pattern mask according to a second embodiment of the present invention includes the following steps.

First, a substrate 200 having an amorphous silicon layer 210 deposited thereon is prepared. Next, the substrate 200 is fixed onto a stage (not shown in the drawing). A laser beam pattern mask is prepared like that shown in FIG. 12. The laser beam pattern mask 150 includes a plurality of first transmitting parts 'D' and a plurality of second transmitting parts 'E' having the same shapes of the first transmitting parts 'D'. Each of the first transmitting parts 'D' includes a central portion and a pair of edge portions provided to both sides of the central portion, respectively. Each of the edge portions has a substantially triangular shape defined by a virtual boundary line with the central portion, an upper outside tilted at an acute angle from an upper end of the virtual boundary line, and a lower outside tilted at the same acute angle α from a lower end of the virtual boundary line. The upper and lower outsides meet each other at one rounded corner. Moreover, the second transmitting part 'E' is located at a position separated from that of the corresponding first transmitting part 'D' by a length 'm' of the central portion in a horizontal direction and a width 'y' of the central portion in a vertical direction.

The laser beam pattern mask 150 is placed above the substrate 200 and a laser beam irradiation is performed. Subsequently, the laser beam pattern mask 150 is moved in a manner such that an edge portion overlaps an adjacent laser beam pattern area on the substrate 200. Then, the laser beam irradiation for crystallization is carried out. In performing the laser beam irradiation, transition of an irradiation (exposed) area on the substrate 200 is made by moving a stage having the substrate 200 fixed thereon. In doing so, a translation distance of the stage is adjusted by a length or width of each of the transmitting parts of the mask and a reduction ratio of a projection lens.

First, an irradiation is made to perform crystallization in a horizontal direction on the amorphous silicon 210 substrate 200 by moving the stage in a (+)X-axis direction to a distance corresponding to the length 'm' of the central portion of the corresponding first transmitting part 'D' of the laser beam pattern mask 150.

Second, the stage is moved in a (+)Y-axis direction to a distance corresponding to the length of the unit region Km to crystallize amorphous silicon 210 on the substrate 200 by one shot of irradiation using the first and second transmitting parts 'D' and 'E'.

Third, irradiation is performed to crystallize amorphous silicon 210 on the substrate 200 to achieve the crystallization in a horizontal direction by moving the stage in a (−)X-axis direction opposite to the direction in the first step to a distance corresponding to the length 'm' of the central portion of the corresponding first transmitting part 'D' of the laser beam pattern mask 105.

The above-explained first to third steps are repeated to crystallize the entire amorphous silicon layer 210 deposited on the substrate 200. Besides, an unexplained reference number '220' in the drawing indicates each crystallized portion of the amorphous silicon layer deposited on the substrate 200. Thus, in order to obtain the uniform crystallization characteristics in each laser beam overlap area, the present invention relates to a laser beam pattern mask and crystallization method using the same, in which a laser beam pattern mask has a central portion and a substantially triangular shaped edge portions. The substantially triangular shaped portions can have a rounded corner.

Accordingly, the present invention brings about the following effects or advantages. First of all, the laser beam pattern mask has a central portion and a substantially triangular shaped edge portions Using the laser beam pattern mask, embodiments of the present invention solves the problem of irregularity of crystallization in the laser beam overlap areas of the substrate. Secondly, the crystallization characteristics become uniform regardless of beam overlap areas across the surface of the substrate in fabricating a thin film transistor array substrate of a flat panel display, whereby uniform device characteristics can be obtained. Accordingly, an image quality of the display device is enhanced as a result of uniform device characteristics.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A crystallization method, comprising the steps of:
   preparing a substrate having an amorphous silicon layer deposited thereon;
   fixing the substrate to a stage;
   placing a laser beam pattern mask over the substrate, the laser beam pattern mask comprising at least one or more transmitting parts, each laser beam pattern including:
   a rectangular central portion; and
   a pair of edge portions provided to both sides of the central portion, each having a substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner; and
   performing a laser beam irradiation for crystallizing the amorphous silicon using the laser beam pattern mask by overlapping the central portion of a next irradiation with an irradiated portion corresponding to the edge portion exposed in a previous irradiation.

2. The crystallizing method of claim 1, the laser beam irradiation performing step comprising:
   a first step of performing a horizontal crystallization by moving the stage in a horizontal direction to a first distance;
   a second step of moving the stage in a vertical direction to a second distance;
   a third step of performing the horizontal crystallization by moving the stage to the first distance in a reverse direction of the horizontal direction of the first step; and
   a fourth step of repeating the first to third steps.

3. The crystallizing method of claim 2, wherein the first distance is about equal to a length of the central portion and the second distance is about equal to a width of the central portion.

4. A crystallization method, comprising the steps of:
   preparing a substrate having an amorphous silicon layer deposited thereon;
   fixing the substrate to a stage;
   placing a laser beam pattern mask over the substrate, the laser beam pattern mask comprising:
   at least one first transmitting part including:
   a rectangular central portion; and
   a pair of edge portions provided to both sides of the central portion, each having substantially triangular shape defined by a virtual boundary line between the central portion and the corresponding edge portion, an upper outside extending from an upper end of the boundary line at an acute angle, and a lower outside extending from a lower end of the boundary line at the acute angle to meet the upper outside at a rounded corner;
   at least one second transmitting part separated from the at least one first transmitting part by a first distance in a horizontal direction equal to a length of the central part or a second distance in a vertical direction equal to width of the central part; and
   performing a laser beam irradiation for crystallizing the amorphous silicon using the laser beam pattern mask by overlapping the central portion of a next irradiation with an irradiated portion corresponding to the edge portion exposed in a previous irradiation.

5. The crystallizing method of claim 4, the laser beam irradiation performing step comprising:
   a first step of performing a horizontal crystallization by moving the stage in a horizontal direction to a first distance;
   a second step of moving the stage in a vertical direction to a second distance;
   a third step of performing the horizontal crystallization by moving the stage to the first distance in a reverse direction of the horizontal direction of the first step; and
   a fourth step of repeating the first to third steps.

6. The crystallizing method of claim 5, wherein the first distance is about equal to a length of the central portion of the at least one first transmitting part and the second distance is about equal to a width of the central portion of the at least one second transmitting part.

* * * * *